United States Patent [19]
Yamaura et al.

[11] Patent Number: 5,876,156
[45] Date of Patent: Mar. 2, 1999

[54] PRINTED-CIRCUIT BOARD HOLDING DEVICE

[75] Inventors: Kouji Yamaura; Tamio Otani, both of Hadano; Akira Irie, Kanagawa-ken, all of Japan

[73] Assignee: Hitachi Seiko, Ltd., Ebina, Japan

[21] Appl. No.: 701,590

[22] Filed: Aug. 22, 1996

[30] Foreign Application Priority Data

Nov. 15, 1995 [JP] Japan .................................. 7-296977
Mar. 29, 1996 [JP] Japan .................................. 8-077275

[51] Int. Cl.$^6$ ............................................. B23B 39/00
[52] U.S. Cl. .......................... 408/95; 408/1 R; 408/97; 408/103
[58] Field of Search .......................... 408/95, 97, 103, 408/98, 1 R

[56] References Cited

U.S. PATENT DOCUMENTS 5,024,562  6/1991  Arai et al. .................................. 408/1 R
5,199,830  4/1993  Otani et al. ................................ 408/98

FOREIGN PATENT DOCUMENTS 003713  1/1991  Japan ........................................ 408/95
354609  12/1992  Japan .
023613  2/1994  Japan .................................. 408/115 B
198509  7/1994  Japan .................................. 408/72 B

*Primary Examiner*—Steven C. Bishop
*Assistant Examiner*—Adesh Bhargava
*Attorney, Agent, or Firm*—Antonelli, Terry, Stout & Kraus, LLP

[57] ABSTRACT

A printed circuit board working machine includes a spindle which holds a cutting tool and is movable to bring the tool into contact with and away from a printed-circuit board to be worked. A device for pressing down the printed-circuit board comprises a support mechanism associated with the spindle of the working machine for relative movement thereto, a plurality of holding sections movably supported by the mechanism and a driving mechanism for the holding sections. The holding sections are formed with holes of different sizes, respectively. When working operation, after the support mechanism causes the holding sections to move away to a position free from interference with the tool, the driving mechanism moves the holding sections to align one of the through holes, corresponding to a size of the tool to be used, with the tool. Subsequently, the support mechanism returns the holding sections to an initial position and, before the tool reaches the printed-circuit board, brings the corresponding holding section into pressure contact with the printed-circuit board.

5 Claims, 6 Drawing Sheets

PRINTED-CIRCUIT BOARD HOLDING DEVICE

BACKGROUND OF THE INVENTION

1. Field of the Invention

The present invention relates to a device which is to be mounted on a printed-circuit board working machine for holding or pressing down a printed-circuit board during working operation. More specifically, the invention relates to a printed-circuit board holding device which has a plurality of holding or pressing sections and changes them according to the size of a portion to be worked of a printed-circuit board.

2. Description of Related Art

In order to precisely work a printed-circuit board, it is necessary to hold or press down the printed-circuit board firmly. For example, in case of perforating the printed-circuit board by means of a drill, it has been customary to hold down the vicinity of a portion to be worked of the printed-circuit board so as to prevent production of any burr along the edge of a drilled hole.

It is convenient for the printed-circuit board working machine to have an equipment for that purpose. A conventional example of this kind of working machine is disclosed in Japanese Patent Unexamined Publication No. 4-354609.

The conventional working machine is constructed to hold a working tool or drill on a spindle and to work a printed-circuit board set on a table through driving of the spindle. A printed-circuit board holding device includes a pressure foot which is provided at an end of the spindle for relative movement thereto. The pressure foot has a through hole for allowing the drill to pass through. When working, the pressure foot is first brought into contact with the printed-circuit board to hold down the board against the table. Subsequently, the drill is passed through the through hole in the pressure foot and brought into contact with the printed-circuit board. In this way, working is performed in a state where the printed-circuit board is held down.

Typically, a plurality of kinds of holes, the sizes of which are different from each other by 0.05 mm –0.1 mm and range from 6.3 mm at the largest to 0.1 mm at the smallest, are formed in the printed-circuit board, and a plurality of sizes of drills are used in working one printed-circuit board. The through hole in the above-described pressure foot is made larger than a diameter of the largest drill so as to allow all the drills to pass through it.

Incidentally, as holding or pressing down of the workpiece is performed closer to the worked position, the effect becomes greater. In case of drilling the printed-circuit board, degree of production of burr depends on a distance between an outside diameter of the hole being drilled and the pressing position. For this reason, it is desirable to hold down the printed-circuit board at as close position to the portion to be worked as possible.

The conventional device described above, as the through hole in the pressure foot is large, has a low pressing effect when working a hole of small diameter. To cope with this, it has been proposed in Japanese Patent Unexamined Publication No. 4-354609 that through holes of various sizes are formed and changed selectively according to the size of tool to be used.

More specifically, the device according to Japanese Patent Unexamined Publication No. 4-354609 has a plurality of holding or pressing sections rotatably or slidably provided on a lower side of the pressure foot. These holding sections have through holes of different diameters, respectively. When working, the holding sections are first moved to align one of the through holes thereof, which matches the size of the tool to be used, with the through hole in the pressure foot. Subsequently, working is performed. In this way, it is possible to perform the working operation while pressing the vicinity of a hole to be formed.

In the device according to Japanese Patent Unexamined Publication No. 4-354609, during selection of a holding section prior to the working, the drill is held at a sufficient distance from the moving holding sections lest it should interfere therewith. Accordingly, the drill must be moved through this distance until it is brought into contact with the printed-circuit board, with the result that the stroke required for the formation of one hole is made large.

SUMMARY OF THE INVENTION

The present invention has an object of providing a printed-circuit board holding device capable of enhancing the working efficiency, while improving the above-described conventional device.

It is another object of the invention to provide a printed-circuit board holding device of highly reliable structure by which an efficient working becomes possible.

The invention first aims at reducing the moving stroke of tool at the time of working to enhance the working efficiency while following the basic structure of the conventional device. For this purpose, a plurality of holding or pressing sections are provided and through holes of different sizes are formed therein, respectively. The holding sections are movable in such a manner that one of the through holes thereof, which matches the tool to be used, is aligned with the tool, and then, before the tool reaches a printed-circuit board on a working machine, the holding section is brought into contact with the printed-circuit board to press it down. These holding sections are selected and changed after having been moved to a position where they are free from interference with the tool, and then returned to another position where they are ready for working.

In the device according to Japanese Patent Unexamined Publication No. 4-354609, a distance between a drill in its standby position and the forward end of a holding section is large, and therefore the vertical stroke of the drill during working is increased. This leads to increase in the time required for the formation of one hole, and hence to reduction in working efficiency.

According to the invention, the holding sections are moved away from the tool only when the through holes are selected and changed. Therefore, a distance between the tool and the surface of the printed-circuit board at the time of working, that is, a working stroke can be reduced to a minimum. Thus, the invention makes it possible to shorten the time required for the working on one spot to increase the number of working operations per unit time and thereby enhance the working efficiency.

Further, according to the invention, a least a part of the structure for guiding movement of the holding sections is disposed generally in parallel to the printed-circuit board to be pressed down so as to properly receive a reaction which acts on the holding section upon pressing down the printed-circuit board. With this arrangement, generation of component force from the pressing force is prevented so that the load applied to a support mechanism for the holding sections can be lightened to enhance the reliability of the device structure.

The improvements by the invention are available without largely altering the structure of the conventional device and have a particular effect of achieving a sharp increase in productivity at relatively low cost.

BRIEF DESCRIPTION OF THE DRAWINGS

The above and other objects, features and advantages of the invention will become more apparent from the description of preferred embodiments, which will be made hereinafter with reference to the appended drawings wherein.

DESCRIPTION OF THE PREFERRED EMBODIMENTS

At the outset, in order to facilitate understanding of the invention, problems of the above-described conventional apparatus will be described with reference to FIGS. 5 to 7.

Figure 5:
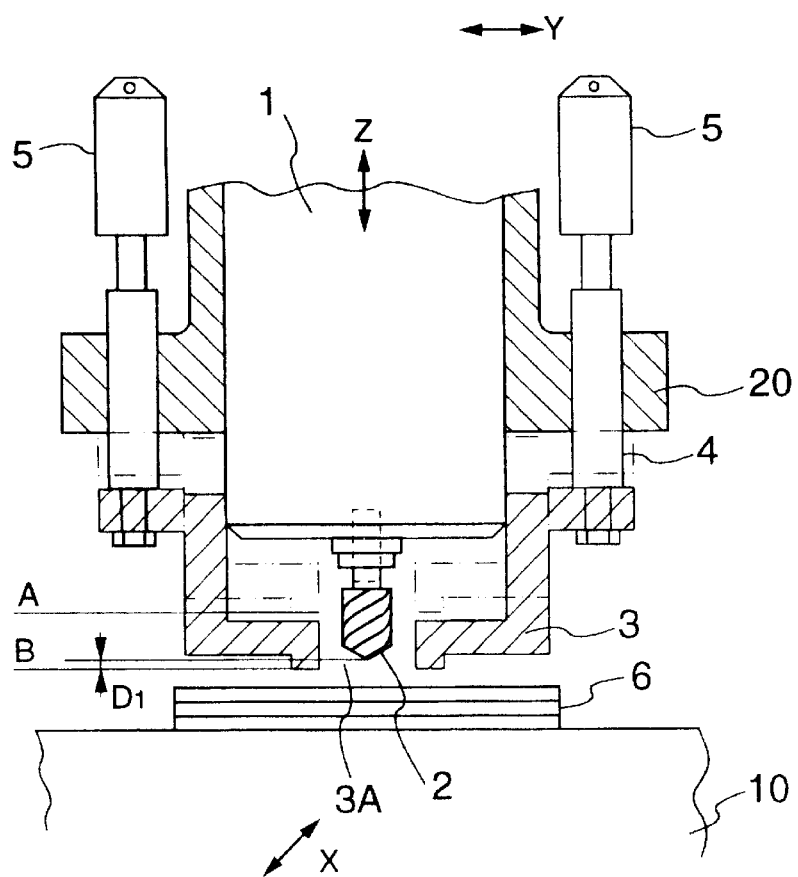
FIG. 5 is a sectional view of a conventional working machine with a printed-circuit board holding device.

The conventional printed-circuit board working machine, referred to at the beginning of the text, comprises a table 10 and a frame (not shown) disposed above the table, as shown in FIG. 5. The table 10 is adapted for mounting and fixing a printed-circuit board 6 thereon. The table 10 and the frame are movable in X-direction and Y-direction in the drawing, respectively. A saddle 20 is mounted on the frame so as to be movable in Z-direction. A spindle 1 is provided on the saddle 20 and a drill 2 is held at a lower end of the spindle A printed-circuit board holding device comprises a pair of cylinders 5 and a pressure foot 3. Each cylinder 5 is supported at one end thereof on the saddle 20. The pressure foot 3 is disposed between the saddle 20 and the table 10 and supported by the cylinders 5 through piston rods 4 thereof. The cylinders 5 energize the pressure foot 3 toward the table 10 with a predetermined pressure. The pressure foot 3 is usually located at a position B in the drawing.

When perforating operation, the saddle 20 is let down to first cause the pressure foot 3 to be brought into contact with the printed-circuit board 6 on the table 10. As the saddle 20 is further let down and the pressure foot 3 is brought into contact with the printed-circuit board 6, pressure of the cylinders 5 acts to hold or press down the printed-circuit board 6 against the table. As a result, the pressure foot 3 is applied with pressing force to press down the printed-circuit board 6 against the table 10. The saddle 20 is still further let down to force the drill 2 into the printed-circuit board 6, thereby performing the drilling. At this time, a distance $D_1$ between the point of the drill 2 and a lower end of the pressure foot 3 is in the range of 1–3 mm. Subsequently, the pressure foot 3 relatively moves upward with respect to the saddle 20 to reach a position A in the drawing at the maximum according to the depth of a hole to be worked.

A through hole 3A in the forward end of the pressure foot 3 has a diameter of about 8 mm for allowing a drill 2 of the largest diameter to pass through it, and therefore, as described above, in case of making a hole of small diameter, the pressing effect is deteriorated.

Figure 6:
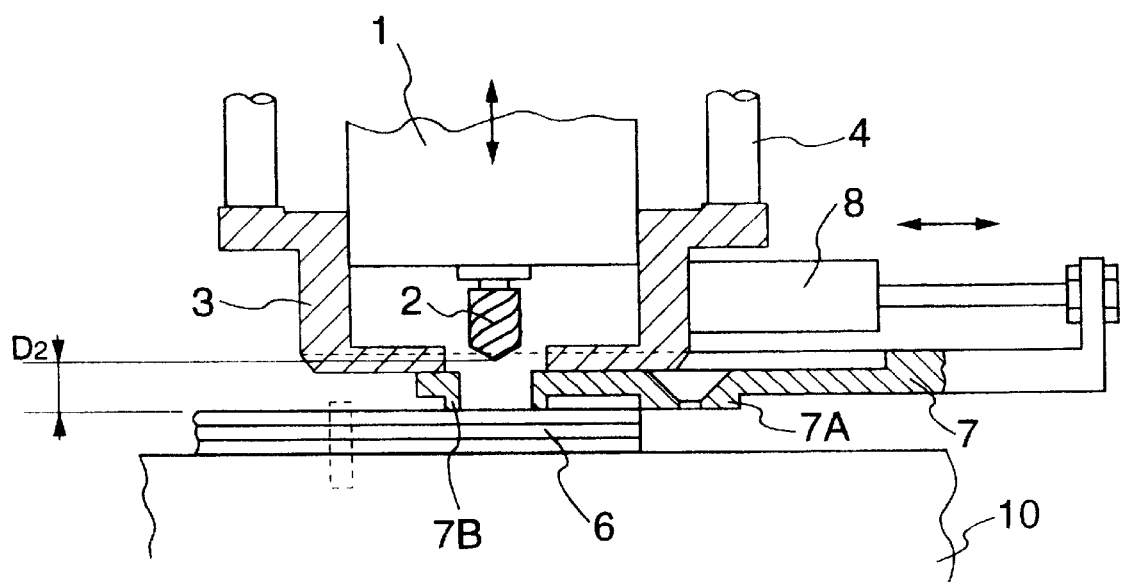
FIG. 6 is a sectional view of another conventional printed-circuit board holding device.
Figure 7:
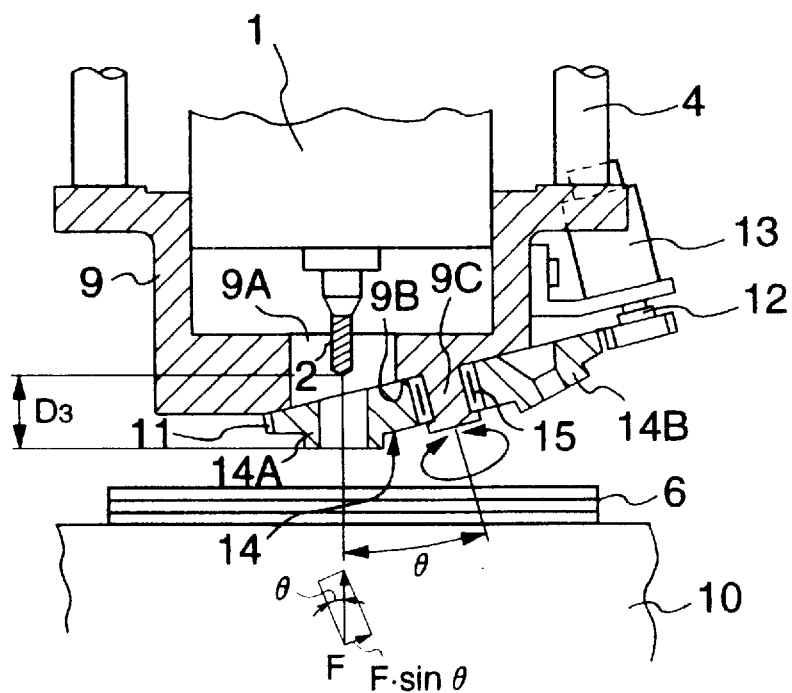
FIG. 7 is a sectional view of a still another conventional printed-circuit board holding device.

FIGS. 6 and 7 each illustrate devices according to Japanese Patent Unexamined Publication No. 4-354609. In the following description, component parts which may be the same with or similar to those of the conventional example described above will be designated by the same reference numerals and explanation thereof will be omitted.

Referring to FIG. 6, a spindle 1 of a printed-circuit board working machine is supported by a saddle (not shown) in the same manner as the above conventional example. The spindle 1 is movable together with the saddle in the vertical direction. A pair of piston rods 4 project out of respective cylinders (not shown) provided on the saddle, and are energized downward. A pressure foot 3 is slidably fitted on an end portion of the spindle 1 and supported by the piston rods 4.

The pressure foot 3 is equipped with a flat slide piece 7 at a lower surface thereof. The slide piece 7 is supported by the pressure foot 3 in such a manner as to be slidable perpendicularly to an axis of the spindle 1, and is connected to a driving cylinder 8. The slide piece 7 is provided with two holding or pressing sections 7A, 7B. The holding sections 7A, 7B are formed therein with through holes of different diameters, respectively. FIG. 6 illustrates a drill 2 of the largest diameter among those to be used. The holding section 7B corresponding to this drill presses down a printed-circuit board 6, the through hole of which has a larger diameter than the drill 2 to allow the drill 2 to pass through it.

In another example shown in FIG. 7 as well, a pressure foot 9 is slidably fitted on an end portion of a spindle 1 and supported by rods 4. The pressure foot 9 has at its axial center a through hole 9A for allowing a drill 2 to pass through. The pressure foot 9 is formed in a lower portion thereof with an inclined surface 9B which crosses the through hole 9A diagonally, and with a support shaft 9C which projects downward from the inclined surface. The support shaft 9C is inclined at a predetermined angle θ with respect to an axis of the drill 2.

A disk-like member 14 is attached to the support shaft 9C through a bearing 15 to be rotatable along the inclined surface 9B. The rotary member 14 has holding or pressing sections 14A, 14B in which through holes of different diameters are formed respectively for allowing the drill to pass through. The rotary member 14 is further formed on an outer periphery thereof with a gear 11. The gear 11 meshes with a gear 12 of a motor 13 so that the member 14 is rotated by driving of the motor.

In either device of FIG. 6 or 7, when working is to be performed, the slide piece 7 or the member 14 is first driven to make one of the through holes, which matches the diameter of the drill 2 to be used, align with the hole of the pressure foot. Owing to such structure, it is possible to hold down a position near the edge of a hole being formed during the working to thereby effectively suppress the production of burr. Incidentally, during selection of the through hole, the drill 2 is held at a higher position lest the point of the drill 2 should interfere with the moving slide piece 7 or member 14. For this reason, a distance from the point of the drill 2 to a lower end of the holding section of the slide piece 7 or member 14 shown by $D_2$ in FIG. 6 or $D_3$ in FIG. 7 is large, resulting in a large amount of vertical movement of the spindle during the working.

Figure 1:
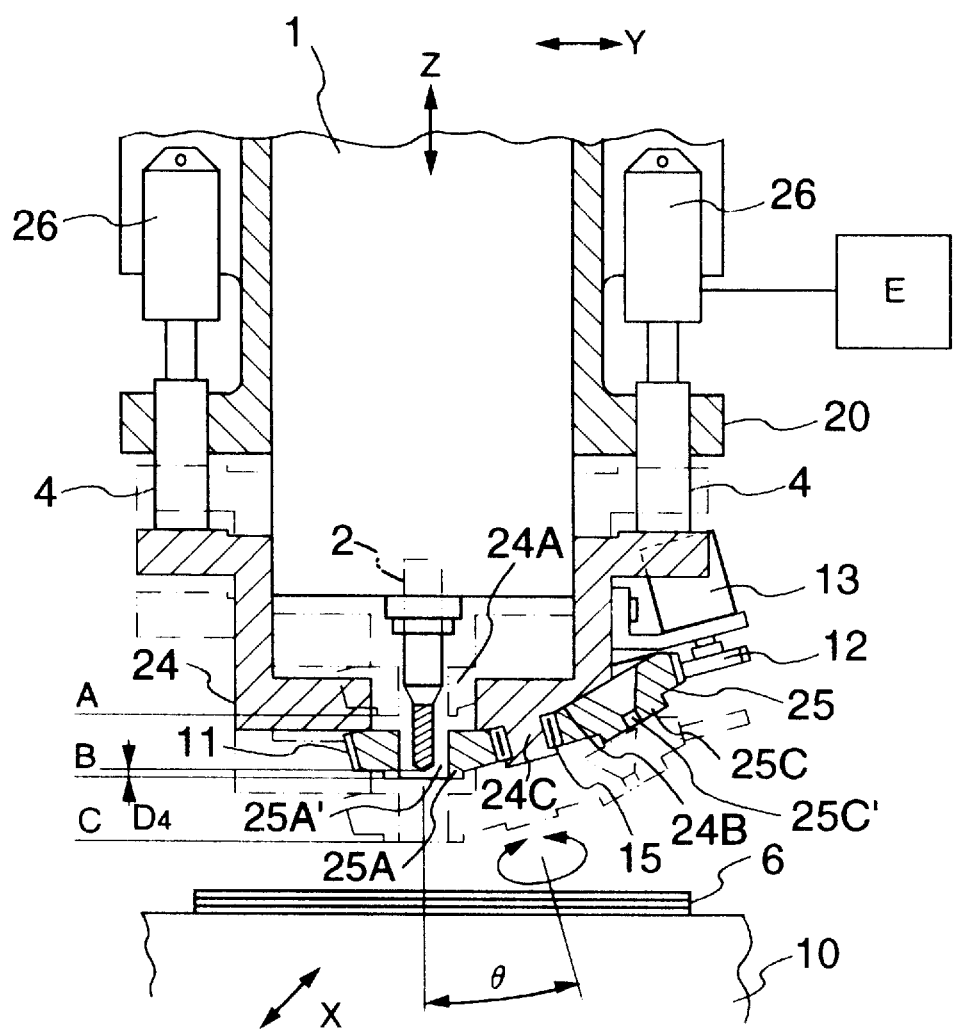
FIG. 1 is a sectional view showing a printed-circuit board holding device according to an embodiment of the invention.

Description will be now given of a printed-circuit board holding device according to an embodiment of the invention with reference to FIG. 1.

FIG. 1 illustrates this device in a state of having been mounted on a printed-circuit board working machine. The working machine comprises a spindle 1, a table 10 and a frame (not shown) in the same manner as the above-described prior arts. The table and the frame are movable in X-direction and Y-direction, respectively. The spindle 1 is supported by a saddle 20 and can move with the saddle in Z-direction, that is, in the vertical direction in the drawing.

A pair of actuators or cylinders 26 are supported by the saddle 20. A piston rod 4 projects out of each of the cylinders and is energized downward.

The cylinders 26 are driven by fluid pressure and can operate through the two-stage stroke. A controller E is connected to the cylinders 26 to control the operation of the printed-circuit board holding device including the cylinders 26.

The piston rods 4 are connected to a pressure foot 24 to constitute a pressure foot supporting mechanism in cooperation with the cylinders 26. The pressure foot 24 is fitted on an end portion of the spindle 1 and slidable along the spindle 1. The pressure foot 24 has, at an axial center of a bottom thereof, a through hole 24A for allowing the drill 2 to pass through. The pressure foot 24 Is provided on a lower surface thereof with a conical surface 24B and a support shaft 24C. The shaft 24C is inclined at a predetermined angle θ with respect to the axis of the spindle 1. The conical surface 24B is formed around the shaft 24C. The conical surface 24B is parallel to a printed-circuit board 6 at its portion adjacent to the drill 2 in the plane of FIG. 1, that is, at its portion extending from the shaft 24C across the axis of the drill 2.

Further, a disk-like member 25 is disposed below the pressure foot 24. There is also provided a driving mechanism 11–13 for moving the member 25. The member 25 is attached to the support shaft 24C through a bearing 15. The member 25 is in a shape complementary with the conical surface 24B so that the member 25 can rotate and slide along the conical surface 24B when driven by the driving mechanism 11–13. On the periphery of the rotary member 25 are formed two holding or pressing sections 25A, 25C. The holding sections 25A, 25C have their lower surfaces made flat so as to be brought into generally parallel contact with the printed-circuit board 6 on the table 10. The holding section 25A has a through hole 25A' of 25 diameter 8 mm, while the holding section 25C has a through hole 25C' of diameter 1 mm. These through holes are each formed in such a manner as to be aligned with the axis of the drill 2 when the associated holding section is moved to below the drill 2.

Figure 2A:
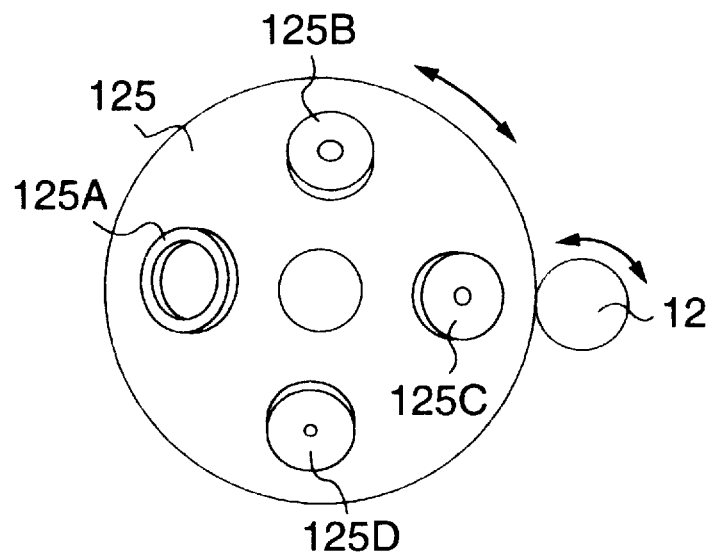
FIG. 2A is a plan view of an example of a rotary member applicable to the device shown in FIG. 1.
Figure 2B:
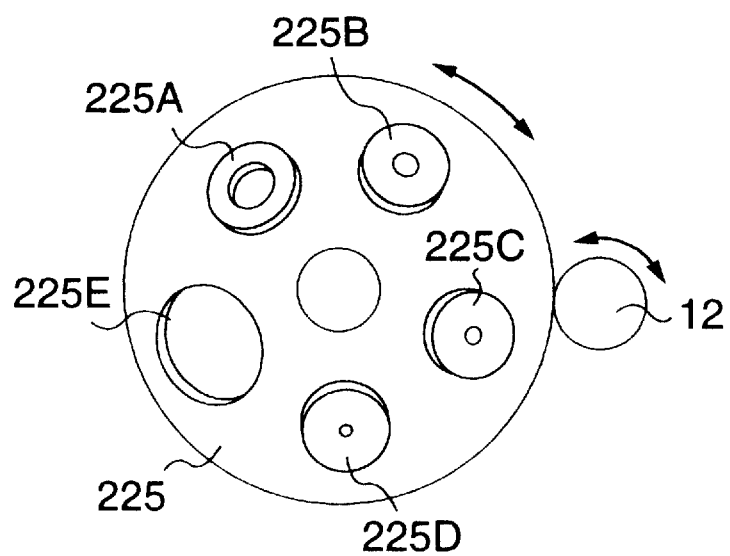
FIG. 2B is a plan view showing a modification of the rotary member of FIG. 2A.

Incidentally, the rotary member 25 may be formed with a plurality of holding sections having various sizes of through holes according to drill diameters, in addition to the holding sections 25A, 25C. FIG. 2A shows a rotary member 125 with four holding sections 125A–125D as a modification. FIG. 2B shows a rotary member 225 having a through hole 225E for replacement of drill in addition to four holding sections 225A–225D. In these embodiments, the holding sections are formed integrally with the rotary member 25, 125 or 225. However, they may be formed separately and fixedly secured to the rotary member.

The pressure foot 24 usually rests at a position B in FIG. 1 in the same manner as the aforementioned conventional devices. At the time of perforating, the pressure foot 24 is relatively moved upward with respect to the saddle 20. At this time, the pressure foot 24 reaches a position A at the highest according to the depth of hole to be formed. Further, in this embodiment, the pressure foot 24 is so designed as to be moved downward beyond the position B.

More specifically, when working operation, the rotary member 25 is driven to rotate, under the control of the controller E, to change the holding section 25A for the holding section 25C or vice versa. In this embodiment, In advance of this operation, the cylinders 26 are actuated to cause the piston rods 4 to project downward still more. The pressure foot 24 is moved down to a position C in FIG. 1. As a result, the point of the drill 2 becomes high above the conical surface 24B of the pressure foot, and the rotary member 25 can rotate without interfering with the drill 2. On finishing the change of the holding section, the cylinders 26 are actuated again to return the pressure foot 24 to the position B. With this structure, a distance $D_4$ between the drill 2 and a lower end of the pressure foot 24 is made remarkably shorter than the distances $D_2$, $D_3$ shown in FIGS. 6 and 7, and can be made substantially equal to the distance $D_1$ in the conventional device shown in FIG. 5.

Further in this embodiment, the guide surface for the rotary member 25 is formed in the shape of a circular truncated cone in which the portion, extending across the axis of the drill 2, is made parallel to the printed-circuit board 6 on the table, to thereby improve the conventional structure.

More specifically, in the conventional device shown in FIG. 7, the guide surface 9B slants upwards to the right as a whole in the plane of FIG. 7. For this reason, when the rotary member 14 presses down the printed-circuit board 6 against the table 10, a force corresponding to F·sinθ is applied through the member 14 to the bearing 15 and the support shaft 9C in proportion to a pressing force F. In this way, while the device is working, a large lateral force is applied to the bearing 15 and the support shaft 9C repeatedly. On the other hand, according to the embodiment of the invention, a reaction resulting when the printed-circuit board is pressed down is entirely supported by the portion of the conical surface 24B parallel to the printed-circuit board, and therefore there is caused no lateral force to the support shaft 24C and the bearing 15. Accordingly, no extra load is applied to the shaft 24C and the bearing 15 to thereby improve the lifetimes of these components.

Figure 3:
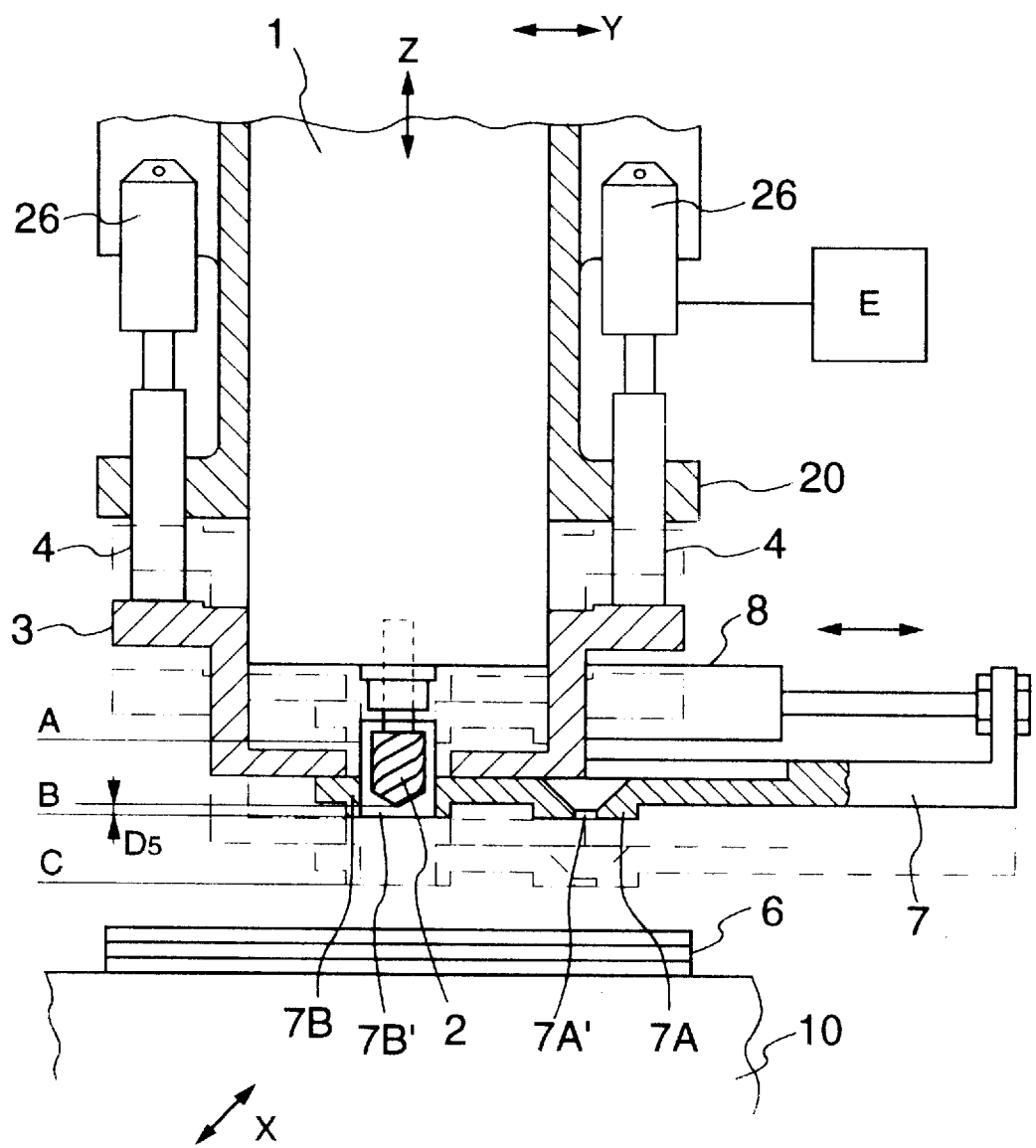
FIG. 3 is a sectional view of a printed-circuit board holding device according to another embodiment of the invention.

FIG. 3 shows a printed-circuit board holding device according to another embodiment of the invention. This device is of the same type as the conventional device shown in FIG. 6. Cylinders 26 are supported by a saddle 20. The cylinders 26 are designed to operate through the two-stage stroke in the same manner as the above embodiment. A piston rod 4 extends downwards from each of the cylinders. A pressure foot 3 is supported by the piston rods 4.

The pressure foot 3 is provided at a lower surface thereof with a slide piece 7. The slide piece 7 is held on the pressure foot 3 in such a manner as to be slidable perpendicularly to an axis of a spindle 1, and is connected to a driving mechanism including a cylinder 8. Holding or pressing sections 7A, 7B are provided on the slide piece 7. These holding sections are formed therein with through holes 7A', 7B' of different diameters, respectively. FIG. 3 shows a drill 2 of the largest diameter among those to be used. The holding section 7B corresponding to the drill is used to press down the printed-circuit board 6. The through hole 7B' has a larger diameter than the drill 2 to permit the drill 2 to pass through it.

The pressure foot 3 is usually located at a level of a position B shown in FIG. 3. On the other hand, when perforating operation, the pressure foot 3 is relatively moved upward with respect to the saddle 20 to reach a position A in the drawing at the highest according to the depth of hole to be formed. Further in this embodiment, the pressure foot 3 is so designed as to be moved downward beyond the position B.

On the occasion of working, the slide piece 7 is driven to slide, under the control of a controller E, to change the holding section 7B for the holding section 7A or vice versa. In this embodiment, in advance of this operation, the cylinders 26 are actuated under the control of the controller E to cause the piston rods 4 to project downward still more. The pressure foot 3 is moved down to a position C in the drawing. The point of the drill 2 becomes high above the sliding surface of the slide piece 7, and the slide piece 7 can slide without interfering with the drill 2. On finishing the change of the holding section, the cylinders 26 are actuated again to return the pressure foot 3 to the position B. In this way, in the present embodiment as well, a distance $D_5$ between the drill 2 and a lower end of the pressure foot 3 can be made substantially equal to the distance $D_1$ in the conventional device shown in FIG. 5 in the same manner as the first embodiment.

According to the two embodiments described above, compared with the device disclosed in Japanese Patent Unexamined Publication No. 4-354609, a vertical moving distance of the spindle during perforation, that is, a working stroke can be made smaller. It is therefore possible to shorten the time required for making one hole to thereby enhance the working efficiency.

Typically, in the process of drilling the printed-circuit board, feed rates in X- and Y-axes are 25.4 m/min, and a feed rate in Z-axis is in the range of 0.5 to 3 m/min. It can be thought to increasing the feed rate in Z-axis in order to improve the productivity, however, this rate depends on the working conditions, and hence, it is difficult in practice to speed up. A reduction in stroke in Z-axis by the present invention will contribute greatly to the increase in productivity.

Figure 4:
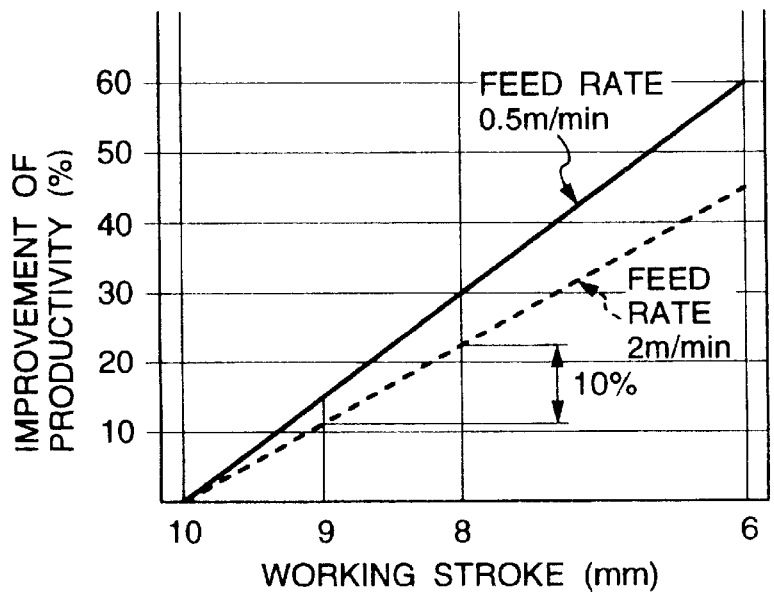
FIG. 4 is a graph showing the relationship between working stroke and increase in productivity (number of working operations per unit time)

FIG. 4 shows the relationship between tools feed rate and productivity. For instance, when the moving or feed rate of spindle is 2 m/min, if a stroke necessary for the working is shortened from 9 mm to 8 mm, the time required for making one hole can be reduced, and it is expected to have the improvement in productivity at about 10%. According to the invention, owing to the above-described reduction in stroke, the number of working operations per unit time is increased to thereby make it possible to improve the efficiency.

Although the invention has been described in conjunction with the embodiments, the invention is not limited solely to these special forms. Various changes and modifications can be made without departing from the scope of the invention defined in the appended claims. For example, the cylinder is adopted for the actuator of the pressure foot in the embodiments but, alternatively, a combination of electric motor and elastic mechanism may be used.

We claim:

1. A device equipped in a printed-circuit board working machine and used for holding or pressing down a printed-circuit board during working, the machine including a table for placement of the printed-circuit board thereon and a spindle movable close to and away from the printed-circuit board on the table and holding a cutting tool at a distal end thereof for working the printed-circuit board, said printed-circuit board holding device comprising:

a pressure foot associated with the distal end of the spindle;

a plurality of holding sections having through holes, for allowing tools of different sizes to pass through, respectively, said holding sections being mounted movably on said pressure foot to align one of the through holes, matching the cutting tool to be used, with the tool, wherein said holding sections are provided on a periphery of the single member, and said member is rotatably mounted on said pressure foot, and said pressure foot being relatively movable with respect to the spindle so that, before the tool reaches the printed-circuit board due to movement of the spindle, a corresponding holding section is brought into contact with the printed-circuit board on the table, said pressure foot being also constructed to be moved away from the spindle until said holding sections reach a position free from interference with the cutting tool during movement of said holding sections for alignment with the tool, whereby when selecting and changing said holding sections, said pressure foot is moved so that said holding sections can be moved without interfering with the tool and, when working the printed-circuit board, said pressure foot is returned to an initial position, thereby minimizing a distance from a point of the tool to the printed-circuit board via said through hole of said holding section, through which the spindle is moved during working, wherein said pressure foot includes a shaft protruding from said pressure foot toward the table and a conical surface formed around said shaft, said shaft is inclined at a certain angle with respect to an axis of the cutting tool, said conical surface is generally in parallel to the printed-circuit board on the table at a portion thereof extending from said shaft across the axis of the cutting tool, and said member is rotatably supported on said shaft and formed in a shape complementary with said conical surface so as to be movable along said conical surface.

2. A device equipped in a printed-circuit board working machine and used for holding or pressing down a printed-circuit board during working, the working machine including a table for placement of the printed-circuit board thereon and a spindle movable close to and away from the printed-circuit board on the table and holding a cutting tool at a distal end thereof for working the printed-circuit board, said printed-circuit board holding device comprising:

a pressure foot associated with the distal end of the spindle;

a plurality of holding sections having through holes, for allowing tools of different sizes to pass through, respectively, said holding sections being mounted movably on said pressure foot to align one of the through holes, matching the cutting tool to be used, with the tool, wherein said holding sections are provided on a periphery of a single member, and said member is rotatably mounted on said pressure foot, and said pressure foot being relatively movable with respect to the spindle so that, before the tool reaches the printed-circuit board due to movement of the spindle, a corresponding holding section is brought into contact with the printed-circuit board on the table, said pressure foot being also constructed to be moved away from the spindle until said holding sections reach a position free from interference with the cutting tool during movement of said holding sections for alignment with the tool, whereby when selecting and changing said holding sections, said pressure foot is moved so that said holding sections can be moved without interfering with the tool and, when working the printed-circuit board, said pressure foot is returned to an initial position, thereby minimizing a distance from a point of the tool to the printed-circuit board via said through hole of said holding section, through which the spindle is moved during working, and at least a cylinder connected to said pressure foot and supporting said pressure foot, wherein said cylinder is operative by working fluid to move said holding sections to the position for selection and change through said pressure foot, wherein said pressure foot includes a shaft protruding from said pressure foot toward the table and a conical surface formed around said shaft, said shaft is inclined at a certain angle with respect to an axis of the cutting tool, said conical surface is generally in parallel to the printed-circuit board on the table at a portion thereof extending from said shaft across the axis of the cutting tool, and said member is rotatably supported on said shaft and formed in a shape complementary with said conical surface so as to be movable along said conical surface.

3. A process of perforating a printed-circuit board while holding the printed-circuit board with a working machine that has a printed-circuit board holding device, the holding device being provided with a plurality of through holes for passage of individual cutting tools, the process comprising the steps of:

moving the holding device vertically with respect to a cutting tool to be used in a direction of a length of the cutting tool to be used to a position clear of the tool;

moving the holding device in a transverse direction to the direction of the length of the tool to align a matching through hole with the tool; and moving the holding device vertically again with respect to the tool to a position ready for working where the tool has entered the matching through hole.

4. The process according to claim 3, wherein in the position ready for working, a distance from a tip of the cutting tool to a lower end of the holding device facing the printed-circuit board is about 1–3 mm.

5. The process according to claim 3, further comprising the step of vertically lowering the holding device and tool in the position ready for working until the holding device presses the printed-circuit board, and then further lowering the tool and perforating the printed-circuit board with the tool.

* * * * *